(12) United States Patent
Steensgaard-Madsen

(10) Patent No.: US 8,878,587 B1
(45) Date of Patent: Nov. 4, 2014

(54) INTERFACE CIRCUIT FOR DRIVING FULLY-DIFFERENTIAL CIRCUITS

(71) Applicant: Linear Technology Corporation, Milpitas, CA (US)

(72) Inventor: Jesper Steensgaard-Madsen, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 14/083,195

(22) Filed: Nov. 18, 2013

Related U.S. Application Data

(60) Provisional application No. 61/847,697, filed on Jul. 18, 2013.

(51) Int. Cl.
*H03L 5/00* (2006.01)
*G05F 3/02* (2006.01)

(52) U.S. Cl.
CPC .................................. *G05F 3/02* (2013.01)
USPC ........................... 327/306; 327/333; 327/561

(58) Field of Classification Search
CPC ... H03F 3/45; H03F 3/45071; H03F 3/45076; H03F 3/45475
USPC .......... 327/104, 306, 333, 560–563; 330/252, 330/253, 258, 259
See application file for complete search history.

(56) References Cited

U.S. PATENT DOCUMENTS

| | | | |
|---|---|---|---|
| 6,259,300 B1* | 7/2001 | Yasuda et al. | 327/333 |
| 6,411,165 B1 | 6/2002 | Delano | |
| 7,750,737 B2* | 7/2010 | Srinivasa et al. | 330/259 |
| 8,248,164 B2* | 8/2012 | Jordan et al. | 330/301 |

OTHER PUBLICATIONS

Steffes; Advantages to precise inout common mode volage control to high performance high speed ADCs; http://www.edn.com/design/analog/4389814/Advantages-to-precise-input-common-mode-voltage-control-to-high-performance-high-speed-ADCs; Jul. 8, 2012.
Floru; Demystifying Analog Circuits in Professional Audio Applications; Audio Engineering Society Convention Paper 6455; Presented at the 118th Convention May 28-31, 2005, Barcelona Spain; pp. 1-16.
Stitt; Boost Instrument AMP CMR With Common-Mode Driven Supplies; Application Bulletin; Jun. 1997, pp. 1-10.
Munson; Easy-to-Use Differential Amplifiers Simplify Balance Signal Designs—Design Note 333; Linear Technology; Design Note; www.linearcom/go/dnLC1992.

* cited by examiner

*Primary Examiner* — William Hernandez
(74) *Attorney, Agent, or Firm* — McDermott Will & Emery LLP

(57) ABSTRACT

An interface circuit for driving a fully-differential circuit has a first circuit configured to decrease the voltage at its output in response to an increase in an average value of first and second input voltages. A first network receives the first input voltage and the output voltage of the first circuit to provide a first output voltage for driving the fully-differential circuit. A second network receives the second input voltage and the output voltage of the first circuit to provide a second output voltage for driving the fully-differential circuit. An impedance ratio of the first network is substantially matched to an impedance ratio of the second network.

31 Claims, 3 Drawing Sheets

$$VP = V(VP, GND) = \frac{V(VIP, GND)*RP2 + V(VREG, GND)*RP1}{RP1 + RP2}$$

$$VN = V(VN, GND) = \frac{V(VIN, GND)*RN2 + V(VREG, GND)*RN1}{RN1 + RN2}$$

$$V(VP, VN) = \frac{V(VIP, VIN)}{(R1/R2) + 1}$$

$$VCM = (VP+VN)/2 = \frac{(VIP+VIN)/2}{(R1/R2) + 1} + \frac{VREG}{1 + (R2/R1)}$$

$$VREG = VCM*(1+(R2/R1)) - (VIP+VIN)/2*(R2/R1)$$

INTERFACE CIRCUIT FOR DRIVING FULLY-DIFFERENTIAL CIRCUITS

This application claims priority of U.S. provisional patent application No. 61/847,697 entitled "INTERFACE CIRCUIT FOR DRIVING FULLY-DIFFERENTIAL CIRCUITS," filed on Jul. 18, 2013 and incorporated herein by reference.

TECHNICAL FIELD

This disclosure relates to analog circuits and methods. Particularly, the present disclosure relates to interfacing fully differential circuits, including analog-to-digital converter circuits.

BACKGROUND ART

Analog-to-digital converters (ADCs) are used for a wide range of applications, including, but not limited to, sensor interfaces, industrial applications, consumer applications, and communications. Various circuits and techniques have been developed for analog-to-digital (A/D) conversion targeting various applications and their varying requirements in terms of speed, resolution, noise, power consumption, and other performance related parameters. Precision low-noise ADCs may be configured for receiving and converting fully-differential input signals with only little common-mode variation allowed. An interface circuit may be required to transform, for example, a single-ended analog input signal to a fully-differential analog signal suitable for interfacing a fully-differential circuit.

FIG. 1 shows an exemplary ADC circuit 100, comprising an interface circuit 101 and a fully-differential ADC 102. ADC circuit 100 may be configured to receive a single-ended input signal VIP within a full-scale range from (−2*VREF) to (+2*VREF), where VREF may be provided by a reference-voltage source 103. For example, VREF may be 5V, and a full-scale range of ADC circuit 100 may be from (−10V) to (+10V). VIN may be biased at a reference potential (ground), VIN=GND, when ADC circuit 100 is configured to convert a single-ended input signal VIP=V(VIP,GND). ADC circuit 100 may be configured such that VIP=(−2*VREF) corresponds to a numerical value d(k)=(−1) and such that VIP=(+2*VREF) corresponds to d(k)=(+1). An idealized behavior may thus be described as d(k)=VIP/(2*VREF) for any input voltage VIP within a full-scale input range.

Fully-differential ADC 102 may be configured to sample two single-ended voltages, VP and VN, at a first ADC input terminal 104 and a second ADC input terminal 105, respectively. The fully-differential ADC 102 may provide numerical values d(k) that nominally represent a difference V(VP,VN)=VP−VN of the sampled voltages VP and VN normalized to the reference voltage VREF, which may be described as d(k)=V(VP,VN)/VREF. For single-ended signals, VP=V(VP,GND) and VN=V(VN,GND). For example, for VREF=5V, VP=4V, and VN=1V, a nominal response may be d(k)=V(VP,VN)/VREF=(4V−1V)/5V=0.6. The fully-differential ADC 102 may require that a common-mode voltage VCM=(VP+VN)/2 be close to a nominal value, say VREF/2. For example, it may be required that (VP+VN) be at least VREF−0.2V, and no more than VREF+0.2V. When a common-mode requirement is fulfilled, the fully-differential ADC 102 may provide good common-mode rejection, such that numerical values d(k) are substantially independent of common-mode voltage VCM and almost exclusively represent sampled voltage differences V(VP,VN).

Interface circuit 101 of FIG. 1 may be implemented using a differential amplifier 106 configured as shown in FIG. 2. Resistors RN1, RP2 are configured to provide at an inverting amplifier input terminal 107, a weighted average of an applied input voltage VIN and a first output voltage VP provided by differential amplifier 106 at a non-inverting first output terminal 104. Likewise, resistors RP1, RN2 are configured to provide at a non-inverting amplifier input terminal 108, a weighted average of an applied voltage VIP and a second output voltage VN provided by differential amplifier 106 at an inverting second output terminal 105. Accordingly, resistors RN1, RP2, RP1, and RN2 are configured to provide negative feedback for differential amplifier 106. Differential amplifier 106 may be configured to provide a very large differential gain ADIFF for voltage differences from amplifier input terminals 107, 108 to output terminals 104, 105, such that, provided stability and non-overload operation, amplifier input terminals 107, 108 may have an only very small voltage difference across them. Differential amplifier 106 may be said to provide a "virtual short" between amplifier input terminals 107, 108 when the differential gain ADIFF approaches infinity. The virtual short may exist (in approximation) for any common voltage on amplifier input terminals 107, 108. Differential amplifier 106 may be configured such that an output common-mode voltage VCM=(VP+VN)/2 is regulated to be nominally the same as an applied control voltage VC. For example, a control voltage VC=VREF/2 may be applied to fulfill a common-mode requirement when driving a fully-differential ADC (a terminal for applying control voltage VC is not shown explicitly in FIG. 1). Accordingly, interface circuit 101 of FIG. 2 may provide an output common-mode voltage VCM=(VP+VN)/2 that is substantially the same as an applied control voltage VC, and an output voltage difference V(VP,VN) that is substantially set by an input voltage difference V(VIP,VIN) and selected values of resistors RN1, RP2, RP1, and RN2. In one exemplary embodiment, it may be selected that RN1=RP1=R1 and RP2=RN2=R2, and a nominal behavior may be described as V(VP,VN)=(R2/R1)*V(VIP,VIN) and VCM=(VP+VN)/2=VC=VREF/2.

Differential amplifier 106 will be subject to real-world imperfections, such as finite gain, nonlinear gain, finite bandwidth, nonlinear bandwidth, non-zero offset, non-zero thermal and flicker-type noise etc. Accordingly, a virtual short of amplifier input terminals 107, 108 will not be perfect, and output voltage difference V(VP,VN) may be distorted with respect to an ideal value (R2/R1)*V(VIP,VIN). ADC 102 (FIG. 1) may evaluate V(VP,VN) and provide a numerical representation d(k) thereof with an accuracy that may be in the order of one part-per-million (1 ppm). Differential amplifier 106 used to implement prior-art interface circuit 101 (FIG. 2) may be required to provide a differential gain ADIFF of more than 1 million to ensure an overall similarly high degree of accuracy. Likewise, an offset of differential amplifier 106 may have to be less than VREF/1,000,000. Noise from differential amplifier 106 will combine with noise from resistors RN1, RP2, RP1, RN2, and result in a level of noise in output voltage difference V(VP,VN) that exceeds a level of noise from the resistors alone. Accordingly, it may be very difficult to provide a differential amplifier 106 for prior-art interface circuit 101 (FIG. 2) that can live up to the performance and accuracy provided by some state-of-the-art ADCs 102 (FIG. 1).

Therefore, there is a need for an interface circuit that would be able to transform a first and a second input voltage VIP, VIN to a first and a second output voltage VP, VN for driving a fully-differential ADC with a selected common-mode voltage VCM=(VP+VN)/2, such that an accuracy of overall ADC circuit, such as the circuit 100, is commensurate with that of a fully-differential ADC, such as the circuit 102.

Further, there is a need for an interface circuit that would be able to transform single-ended voltages VIP=V(VIP,GND) =V(VIP,VIN) as well as generic-type voltage differences V(VIP,VIN) for which a common-mode voltage (VIP+VIN)/2 may not be tightly specified or controlled.

SUMMARY OF THE DISCLOSURE

In accordance with one aspect of the present disclosure, an interface circuit is provided for driving a fully-differential circuit. The interface circuit is configured to receive a first input voltage and a second input voltage, and further configured to provide a first output voltage and a second output voltage. The interface circuit may comprise:

a first circuit configured to receive the first and second input voltages, and provide a voltage at the output of the first circuit; the first circuit is configured to decrease the voltage at the output of the first circuit in response to an increase in an average value of the first and second input voltages;

a first network configured to receive the first input voltage and the voltage at the output of the first circuit, and further configured to provide the first output voltage; the first network is characterized by a first impedance ratio; and a second network configured to receive the second input voltage and the voltage at the output of the first circuit, and further configured to provide the second output voltage; the second network is characterized by a second impedance ratio substantially matched to the first impedance ratio.

For example, the first impedance ratio may be substantially the same as the second impedance ratio.

In an exemplary embodiment of the present disclosure, the first circuit may be a regulator circuit configured to receive the first and second input voltages, and produce a regulator voltage at its output, where the regulator voltage decreases in response to an increase in an average value of the first and second input voltages.

The first impedance ratio may be substantially a ratio of impedance values of two resistors included in the first network, and the second impedance ratio may be substantially a ratio of impedance values of two resistors included in the second network.

The first output voltage may be substantially a weighted average of the first input voltage and the regulator voltage.

The first impedance ratio may be substantially equal to one.

The first and second networks may be interchangeable.

The first and second networks may be incorporated within a differential network.

In accordance with an exemplary implementation, the first network may include a first resistor having a first terminal coupled to a first input node biased at the first input voltage and having a second terminal coupled to a first output node at which the first output voltage is provided. Also, the first network may include a second resistor having a first terminal coupled to the second terminal of the first resistor and a second terminal coupled to a node at which the regulator voltage is provided. The second network may include a third resistor having a first terminal coupled to a second input node biased at the second input voltage and having a second terminal coupled to a second output node at which the second output voltage is provided. Also, the second network may include a fourth resistor having a first terminal coupled to the second terminal of the third resistor and a second terminal coupled to the node at which the regulator voltage is provided.

The regulator circuit may be distinct from the first and second networks and may be coupled to the first and second networks at only 3 circuit nodes—the first and second input nodes and the node at which the regulator voltage is provided.

The regulator circuit may comprise an operational amplifier and a third network characterized by a third impedance ratio; the third impedance ratio may be substantially matched to the first and second impedance ratios. The third network may be a resistive network.

In an exemplary embodiment, the third network may include fifth and sixth resistors coupled between the first and second input nodes, and a seventh resistor coupled between a node connecting the fifth and sixth resistors and the node at which the regulator voltage is provided. The seventh resistor may be provided between an inverting input and an output of the operational amplifier.

An impedance value of the fifth resistor may be substantially equal to an impedance value of the sixth resistor, which may be substantially equal to two times an effective impedance value of a parallel configuration representing the fifth and sixth resistors. The third impedance ratio may be a ratio of the effective impedance value of the parallel configuration and an impedance value of the seventh resistor.

For example, the interface circuit of the present disclosure may be configured to drive a fully-differential analog-to-digital converter.

The fully-differential analog-to-digital converter may be implemented on a semiconductor substrate shared with at least a portion of the interface circuit.

The interface circuit and the fully-differential analog-to-digital converter may be enclosed in a shared package.

A difference between the first and second output voltages may be substantially independent of an average value of the first and second input voltages.

Also, a difference between the first and second output voltages may be substantially independent of the regulator voltage provided by the regulator circuit.

The regulator circuit may be further configured to receive a control voltage. The regulator voltage provided by the regulator circuit may be substantially a linear combination of the first and second input voltages and the control voltage.

For example, an average value of the first and second output voltages may be substantially equal to the control voltage.

In an exemplary embodiment, the regulator circuit may comprise a switched capacitor.

An input impedance of the interface circuit may be substantially resistive.

In accordance with another aspect of the present disclosure, an analog-to-digital converter (ADC) circuit includes a fully-differential ADC and an interface circuit for driving the fully-differential ADC, the interface circuit being configured to receive a first input voltage and a second input voltage, and further configured to provide a first output voltage and a second output voltage. The interface circuit comprises:

a first circuit configured to receive the first and second input voltages, and provide a voltage at an output of the first circuit; the first circuit is configured to decrease the voltage at the output of the first circuit in response to an increase in an average value of the first and second input voltages;

a first network configured to receive the first input voltage and the voltage at the output of the first circuit, and further configured to provide the first output voltage; the first network being characterized by a first impedance ratio; and a second network configured to receive the second input voltage and the voltage at the output of the first circuit, and further configured to provide the second output voltage; the second network being characterized by a second impedance ratio substantially matched to the first impedance ratio.

In accordance with a method of the present disclosure, a fully-differential circuit is being driven using an interface circuit having a first circuit and first and second networks coupled to the first circuit. The following steps are carried out for driving the fully-differential circuit:

providing the first circuit with first and second input voltages, decreasing an output voltage of the first circuit in response to an increase in an average value of the first and second input voltages, supplying the first input voltage and the output voltage of the first circuit to the first network to produce a first output voltage for driving a first input of the fully-differential circuit, and supplying the second input voltage and the output voltage of the first circuit to the second network to produce a second output voltage for driving a second input of the fully-differential circuit, wherein an impedance ratio of the first network is substantially matched to an impedance ratio of the second network.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

Figures 3, 4, 5, 6, 7:
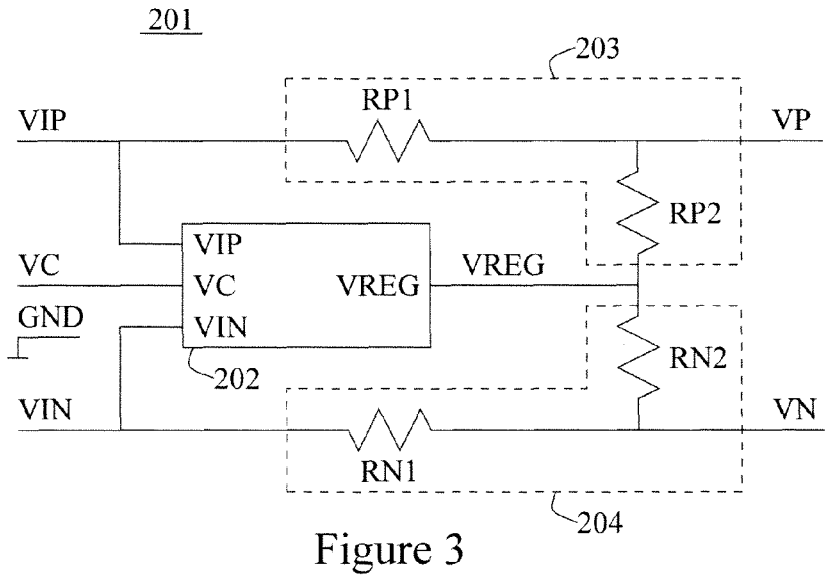
FIG. 3 illustrates a first exemplary embodiment of the present disclosure including an interface circuit 201, which may be used in place of the interface circuit 101 in ADC circuit 100 of FIG. 1.
FIG. 4 illustrates expressions for a first and a second output voltage, VP and VN, for interface circuit 201 of FIG. 3.
FIG. 5 illustrates an expression for an output voltage difference V(VP,VN) for an applied input voltage difference V(VIP,VIN) when a first impedance ratio (RP1/RP2) is matched to a second impedance ratio (RN1/RN2) using a notation (R1/R2)=(RP1/RP2)=(RN1/RN2).
FIG. 6 illustrates an expression for a common-mode voltage VCM for VP and VN, derived from expressions provided in FIG. 4 when a first impedance ratio is matched to a second impedance ratio (R1/R2)=(RP1/RP2)=(RN1/RN2).
FIG. 7 illustrates an expression for a nominal regulator voltage VREG provided by the regulator circuit 202 in FIG. 3 wherein VCM may be substituted by an applied control voltage VC for regulating VCM=(VP+VN)/2 and wherein (R1/R2)=(RP1/RP2)=(RN1/RN2).

FIG. 3 shows an exemplary embodiment of the present disclosure. In particular, FIG. 3 shows an interface circuit 201 which may be used in place of interface circuit 101 of FIG. 1 for driving fully-differential ADC 102. Interface circuit 201 is configured to receive a first and a second input voltage, VIP=V(VIP,GND) and VIN=V(VIN,GND), and is further configured to provide a first and a second output voltage, VP=V(VP,GND) and VN=V(VN,GND). Interface circuit 201 comprises a regulator circuit 202 configured to receive first and second input voltages VIP, VIN and a control voltage VC=V(VC,GND). Regulator circuit 202 is further configured to provide a regulator voltage VREG=V(VREG,GND) for setting an output common-mode voltage VCM=(VP+VN)/2. In an exemplary embodiment of the present disclosure, regulator circuit 202 may be an open-loop circuit. However, as one skilled in the art would realize, closed-loop control also may be used to provide regulator voltage VREG for setting the common-mode voltage VCM.

Interface circuit 201 comprises first network 203 including resistors RP1 and RP2, configured to receive first input voltage VIP and regulator voltage VREG, and further configured to provide first output voltage VP. First network 203 may be a passive network and may be characterized by a first impedance ratio (RP1/RP2), where RP1 and RP2 may be resistances of the respective resistors. Interface circuit 201 further comprises a second network 204 including resistors RN1 and RN2, configured to receive second input voltage VIN and regulator voltage VREG, and further configured to provide second output voltage VN. Second network 204 may be a passive network and may be characterized by a second impedance ratio (RN1/RN2), where RN1 and RN2 may be resistances of the respective resistors. First and second impedance ratios may be nominally matched (RP1/RP2)=(RN1/RN2). Regulator circuit 202 is distinct from first and second networks 203, 204. Regulator circuit 202 is coupled to first and second networks 203, 204 at only three nodes, respectively representing first input voltage VIP, second input voltage VIN, and the regulator voltage VREG. Optional connections via a power supply terminal, including GND, may not be counted.

First network 203 may be a resistor divider circuit providing first output voltage VP as a first weighted average of first input voltage VIP and regulator voltage VREG in accordance with the first impedance ratio (RP1/RP2). Likewise, second network 204 may be a resistor divider circuit providing second output voltage VN as a second weighted average of the second input voltage VIN and regulator voltage VREG, in accordance with the second impedance ratio (RN1/RN2). Expressions for VP and VN expressed as first and second weighted averages are provided in FIG. 4. First and second networks 203, 204 may be interchangeable and/or included in a differential network.

For example, resistor RP1 of first network 203 may be coupled between an input node for receiving first input voltage VIP and an output node that provides first output voltage VP. Resistor RN1 of second network 204 may be coupled between an input node for receiving second input voltage VIN and an output node that provides second output voltage VN. Resistors RP2 and RN2 may be coupled between the output nodes for providing output voltages VP and VN, where regulator voltage VREG is supplied to a common node between resistors RP2 and RN2.

First and second impedance ratios may be matched, (RP1/RP2)=(RN1/RN2), and they may be represented by a nominal matched impedance ratio (R1/R2)=(RP1/RP2)=(RN1/RN2). (R2/R1) may represent a reciprocal value of the nominal matched impedance ratio (R1/R2).

FIG. 5 provides an expression for output voltage difference V(VP,VN) derived from the expressions in FIG. 4 for matched impedance ratios (RP1/RP2)=(RN1/RN2). Accordingly, a difference between first and second output voltages, V(VP,VN), may be substantially independent of an average value of first and second input voltages, (VIP+VIN)/2, and may be further substantially independent of regulator voltage VREG provided by regulator circuit 202.

FIG. 6 provides an expression for an output common-mode voltage VCM=(VP+VN)/2 derived from expressions in FIG. 4 for matched impedance ratios (R1/R2)=(RP1/RP2)=(RN1/RN2). Accordingly, output common-mode voltage VCM=(VP+VN)/2 may be a third weighted average of input common-mode voltage (VIP+VIN)/2 and regulator voltage VREG in accordance with matched impedance ratio (R1/R2). Accordingly, regulator voltage VREG may be derived from input common-mode voltage (VIP+VIN)/2 and matched impedance ratio (R1/R2) to achieve a desired output common-mode voltage VCM, which may be indicated by control voltage VC.

The expression of FIG. 6 can be re-arranged as provided in FIG. 7. By substituting output common-mode voltage VCM by control voltage VC, the expression of FIG. 7 describes a nominal operation of regulator circuit 202 for matched impedance ratios (RP1/RP2)=(RN1/RN2). Accordingly, a nominal operation of regulator circuit 202, expressed in FIG. 7 for VCM=VC, may be to regulate output common-mode voltage VCM to nominally be equal to control voltage VC for arbitrary input voltages VIP, VIN. Regulator circuit 202 may thus be configured to decrease the regulator voltage VREG in response to an increase in an average of the first and second input voltages (VIP+VIN)/2. Equivalently, regulator circuit 202 may be configured to increase the regulator voltage VREG in response to a decrease in an average of the first and second input voltages (VIP+VIN)/2.

Figure 8:
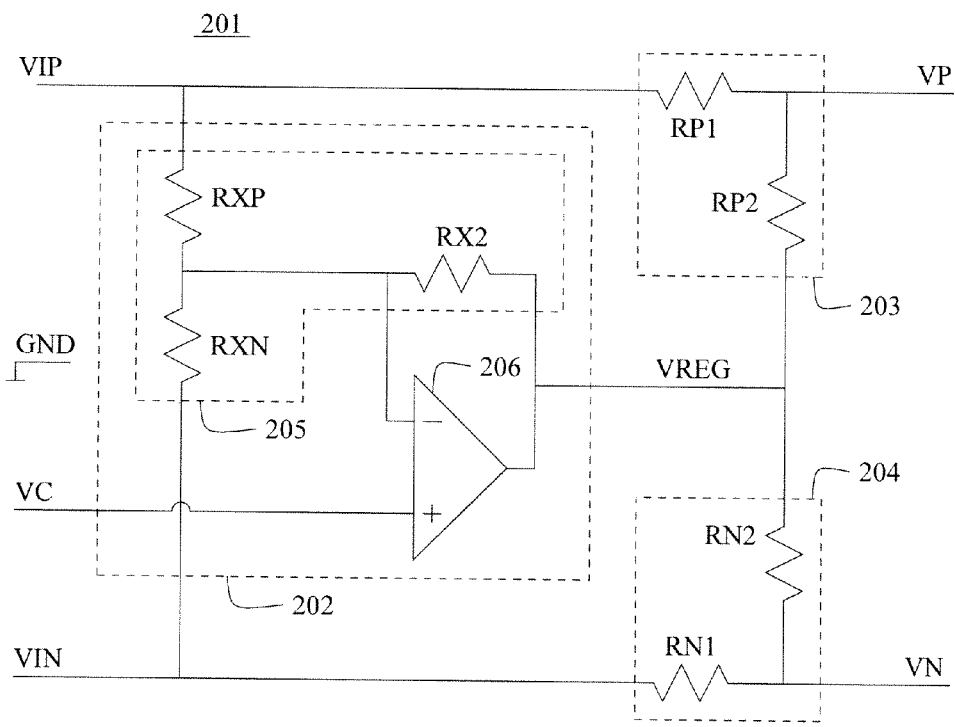
FIG. 8 illustrates interface circuit 201 (FIG. 3) including an exemplary implementation of the regulator circuit 202 comprising an operational amplifier 206 and resistors RXP=RXN=2*RX1 and RX2, wherein a third impedance ratio (RX1/RX2) may be selected to match first and second impedance ratios such that (RX1/RX2)=(RP1/RP2)=(RN1/RN2).

FIG. 8 shows an exemplary implementation of interface circuit 201 in FIG. 3, including an exemplary implementation of regulator circuit 202. Regulator circuit 202 may comprise a third network 205 including a plurality of resistors RXP, RXN, RX2. Resistor values RXP and RXN of the respective resistors may be nominally matched RXP=RXN=2*RX1 and may be characterized by an effective parallel-configuration impedance RX1. A third impedance ratio, (RX1/RX2), characterizing third network 205 may be matched to the first and second impedance ratios characterizing first and second networks 203, 204, such that nominally (RX1/RX2)=(RP1/RP2) =(RN1/RN2)=(R1/R2). Regulator circuit 202 further comprises a single-ended operational amplifier 206. Third network 205 may be resistive and configured to provide negative feedback for operational amplifier 206, as shown in FIG. 8.

For example, resistors RXP and RXN of third network 205 may be coupled between input nodes VIP and VIN. A common node between resistors RXP and RXN may be coupled to an inverting input of operational amplifier 206. Resistor RX2 may be coupled between an output and the inverting input of operational amplifier 206. A non-inverting input of operational amplifier 206 may be supplied with control voltage VC, and regulator voltage VREG may be provided at the output of operational amplifier 206.

Those skilled in the art would realize that the well-known principle of superposition may be used to calculate a first contribution to VREG from VIP with a first gain of (−RX2/RXP), a second contribution to VREG from VIN with a second gain of (−RX2/RXN), and a third contribution to VREG from VC with a third gain of (RX2/(RXP//RXN)+1) =(RX2/RX1+1). Accordingly, for matched impedance ratios (RP1/RP2)=(RN1/RN2)=(RX1/RX2)=(R1/R2), regulator circuit 202 of FIG. 8 may be described by the expression provided in FIG. 7 for VCM=VC. Accordingly, regulator circuit 202 may nominally regulate output common-mode voltage VCM=(VP+VN)/2 to track control voltage VC. Construction of operational amplifiers is well known to those ordinarily skilled in the art, and it need not be described herein.

Mismatch of impedances in the first, second, and/or third networks 203, 204, 205, and/or imperfections of operational amplifier 206 may cause a small perturbation of output common-mode voltage VCM=(VP+VN)/2 with respect to control voltage VC. This is typically not a problem, because the perturbation may be smaller than what may be required by a fully-differential circuit receiving V(VP,VN).

Figure 1:
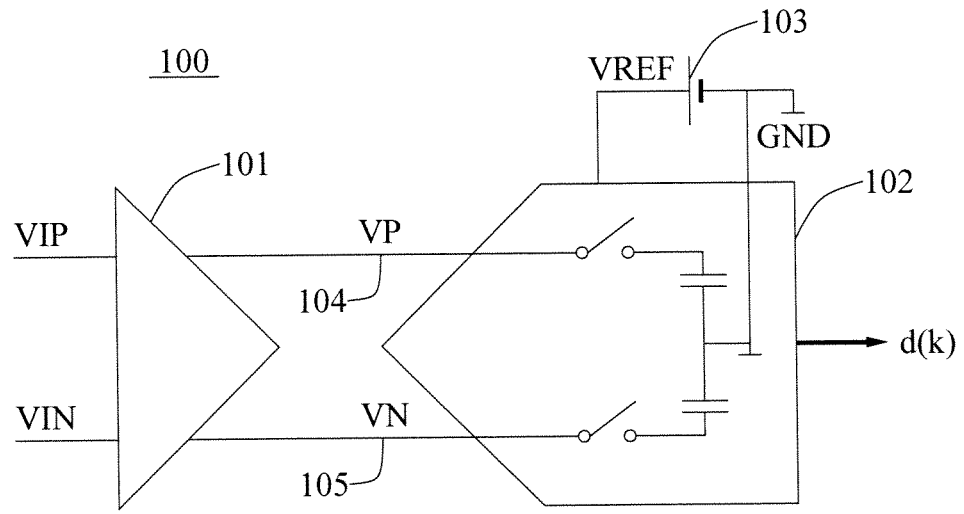
FIG. 1 illustrates an ADC circuit 100 comprising a fully-differential ADC 102 and an interface circuit 101.

Interface circuit 201 may contribute some amount of noise and other artifacts that may be observed as a modulation of output common-mode voltage VCM=(VP+VN)/2. Such common-mode modulation may be suppressed by a typically large common-mode rejection ratio characterizing a fully-differential ADC configured to receive and evaluate V(VP, VN), as shown in FIG. 1. For example, interface circuit 201 (in place of interface circuit 101 in FIG. 1) may be configured to keep modulation of VCM=(VP+VN)/2 at a level that is at least 60 dB below a full-scale, and fully-differential ADC 102 may provide 80 dB common-mode rejection, resulting in an overall disturbance that may be only a small fraction of one part-per-million.

Some amount of noise and other artifacts may also be observed in the regulator voltage VREG. A mismatch of first impedance ratio (RP1/RP2) relatively to second impedance ratio (RN1/RN2) may cause noise/artifacts on VREG to appear as noise/artifacts on output voltage difference V(VP, VN). State-of-the-art performance can be achieved by firstly minimizing noise and artifacts on the regulator voltage VREG and secondly providing good matching of first and second impedance ratios. For example, regulator circuit 202 may be configured to keep noise and artifacts on regulator voltage VREG at a level that is at least 60 dB below a full-scale. First and second networks 203, 204 may be implemented using well-matched precision resistors, such that any mismatch of first and second impedance ratios (RP1/RP2) and (RN1/RN2) may be, for example, less than about 0.01%. Accordingly, any noise/artifacts on regulator voltage VREG will be suppressed by approximately 80 dB when observed at V(VP,VN), ensuring that a resulting disturbance will be only a small fraction of one part-per-million.

Those skilled in the art would appreciate a further advantage of the present disclosure compared to the conventional interface circuit 101. Output voltage difference V(VP,VN) may be evaluated by a fully differential ADC sampling V(VP, VN) on a differential capacitor C. A thermal noise process is associated with sampling a voltage on a capacitor C, and those skilled in the art may recognize that the total noise power may be $k*T/C$, where k is the Boltzmann constant, and T is the absolute temperature. The $k*T/C$ result is typically derived by assuming a sampling switch impedance, and by observing that there may be an inverse relationship between noise power spectral density and noise bandwidth. As a result, the total noise power k*T/C may be independent of the sampling switch impedance. On the one hand, for prior-art interface circuit 101 (FIG. 2), it may be observed that resistors RN1, RP2, RP1, RN2 contribute thermal noise to V(VP,VN), and that there is not an inverse relationship between noise power spectral density and noise power. Accordingly, even if differential amplifier 106 is noiseless, a total noise power may exceed k*T/C when sampling output voltage difference V(VP,VN) on capacitor C. On the other hand, for the present disclosure, exemplified here by interface circuit 201 in FIG. 8, resistors RP1, RP2, RN1, RN2 also contribute noise to V(VP, VN) when a sampling switch is closed. However, output impedance of first and second networks 203, 204 and sampling capacitance C may establish an inverse relationship between noise bandwidth and noise power spectral density observed in V(VP,VN). As a result, a total noise power may be only k*T/C after opening the sampling switch. Accordingly interface circuit 201 may contribute only little, if any, additional noise when driving a fully-differential ADC.

Figure 2:
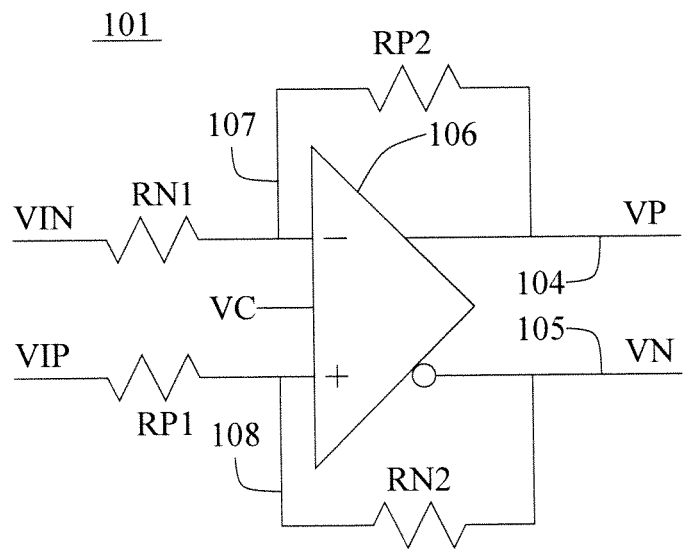
FIG. 2 illustrates an interface circuit 101 comprising a differential amplifier 106 in a negative-feedback configuration with resistors RN1, RP2, RP1, and RN2.

It will be understood by those skilled in the art that the present disclosure may provide improved linearity and noise performance while imposing only relatively relaxed requirements on, for example, operational amplifier 206 (as compared to, for example, differential amplifier 106 of the conventional interface circuit 101 in FIG. 2). For example, an open-loop gain of 1,000 (i.e., 60 dB), and an offset of at most 10 mV may be easily achieved, and may be sufficient to achieve 1 ppm overall accuracy. Relatively relaxed requirements represent a significant advantage and objective of the present teaching.

Overall linearity of interface circuit 201 (FIG. 8) may be better than a linearity of individual resistors RP1, RP2, RN1, RN2 (first and second networks 203, 204 in FIG. 8). Nonlinearity of resistors may be expressed (partly) in terms of voltage and temperature coefficients. The expression provided in FIG. 5 indicates that an overall linearity depends on a linearity of an impedance ratio (R1/R2), for which non-linear terms may be made to cancel. Accordingly, in an exemplary embodiment of the present disclosure, first and second networks 203, 204 may be realized as combinations of unit elements that are tightly coupled thermally. For example, resistors RP1, RN1, RP2, RN2 may each be implemented as a parallel-serial combination of 16 unit resistors R (e.g., RP1=RP2=RN1=RN2=4R//4R//4R//4R), and the 4*16=64 unit resistors may be configured in a compact 8-by-8 layout array. The resistors may be configured in a shared package, or preferably configured as an integrated circuit on a shared semiconductor substrate.

In an exemplary embodiment, a full-scale range of input voltage difference V(VIP,VIN) may be from (−10V) to (+10V), and a full-scale range of a differential ADC 102 (FIG. 1) evaluating output voltage difference V(VP,VN) may be from −5V to +5V. A desired scaling factor may be achieved by selecting first and second impedance ratios to be unity, and first and second networks may each comprise 2 well-matched resistors RP1=RP2 and RN1=RN2. Other scaling factors may be selected by selecting other values for resistors RP1, RP2, RN1, and RN2. Unity impedance ratios (R1/R2)=1 may facilitate better matching and overall linearity performance than non-unity impedance ratios.

Requirements to operational amplifier 206 (FIG. 8) may be relatively relaxed and easy to meet. Operational amplifier 206 may thus be implemented using an integrated circuit technology well suited for implementation of ADCs (for example, a CMOS technology), and may be not so well suited for implementation of high-performance operational amplifier circuits. Accordingly, the present disclosure provides an improved interface circuit 201 that may be implemented on a semiconductor substrate shared with an ADC, facilitating full integration of the ADC system 100 (FIG. 1).

Some fully-differential ADCs may impose only very loose requirements for VCM=(VP+VN)/2, in which case the third impedance ratio (RX1/RX2) characterizing third network 205 may be selected relatively freely and possibly substantially different from first and second impedance ratios (RP1/RP2) and (RN1/RN2) characterizing first and second networks 203, 204. The third impedance ratio may be selected, for example, to relax requirements in terms of power supplies needed for operational amplifier 206. While not shown explicitly in FIG. 7, those skilled in the art will recognize that power supplies are provided to operational amplifier 206. The third impedance ratio may, for example, be selected to maximize a signal swing and a dynamic range for a given set of power supply requirements.

Impedances RP1, RP2, RN1, RN2, RXP, RXN, RX2 need not be primarily resistive, but may be any type of impedance, including resistive, capacitive, inductive, or any combination thereof. A frequency response of first, second, and/or third impedance ratios need not be substantially constant versus frequency, and may include non-cancelling poles and/or zeros.

Interface circuit 201 in FIG. 8 may obtain a low-pass filter characteristic by configuring a first capacitor CP between VP and GND and a second capacitor CN between VN and GND (not shown in FIG. 8). Alternatively, in another exemplary embodiment, an equivalent low-pass filter characteristic may be obtained by placing a smaller differential capacitor CDIFF=CP/2=CN/2 between VP and VN (not shown in FIG. 8). Numerous variations of the present disclosure may be provided. For example, first and second networks may be not distinct, but rather configured within a differential network having first and second input nodes for receiving VIP, YIN; first and second output nodes for providing VP, VN; a common node for receiving regulator voltage VREG; and optional connections to GND and other fixed potential. The exemplary embodiments described in this paragraph are examples for providing a differential network comprising CP, CN, and/or CDIFF.

A frequency response of the third network may be selected according to a frequency response of the first and second networks to achieve desired frequency responses from inputs VIP, VIN to outputs VP, VN. For example, in one embodiment, an interface circuit may be as shown in FIG. 8 with an additional capacitor (not shown) connected between VP and VN. In another embodiment, an interface circuit may be as shown in FIG. 8, wherein RP1 and RN1 are substituted by capacitors CP1 and CN1, and wherein resistors RXP and RXN are substituted by capacitors CXP=CX1/2, CXN=CX1/2, for matching impedance ratios which may be expressed as time constants CP1*RP2=CN1*RN2=CX1*RX2.

Interface circuit 201 in FIG. 8 incorporates resistors RXP, RXN, and RX2 in combination with operational amplifier 206 to provide a nominal response of regulator circuit 202. Other embodiments of the present disclosure may provide a switched-capacitor circuit, or some other circuit technique, to provide a regulator circuit having a similar response. Accordingly, the third network 205 need not be of the same type as first and second networks 203, 204 (FIG. 8). For example, one type of network may be switched-capacitor, the other type network may be resistive.

Interface circuit 201 (FIG. 8) may be provided in a package shared with a fully-differential ADC. An input impedance of interface circuit 201 may be substantially resistive. Resistors external to the shared package may be configured to provide resistive voltage division with the substantially resistive input impedance of interface circuit 201, such that an external extended full-scale range (say −100V to +100V) maps to a nominal full-scale range (say −10V to +10V) for V(VIP, VIN).

Numerous variations of the present disclosure are envisioned. An appropriate choice of circuitry may depend on a specific application and other factors such as available types of semiconductors, capacitors, resistors, reliability voltage limits, silicon area, cost, and additional factors and considerations typically involved in a design of an integrated circuit. Various embodiments may incorporate switches implemented as CMOS transmission-gate switches, bootstrapped switches, single-device switches, and/or any other suitable switching devices. For example, an operation of a switch may involve circuits of a type known as "switched-opamp", wherein a switch is an implicit aspect of controlling an output impedance of an amplifier.

An interface circuit implemented according to the present disclosure may incorporate various types of semiconductor devices (including all flavors of MOS, BJT, IGBT, IGFET, WET, FINFET, organic transistors, nano-carbon-tube devices, electro-mechanical switches etc.), some of which may be selected to withstand high-voltage signals, and some of which may be selected for fast settling of low-voltage circuit nodes.

An interface circuit may be implemented using a process technology that provides asymmetrical devices (BCD etc.) in addition to symmetrical MOS devices, and a process technology may incorporate oxides and other physical structures having various dimensions and electrical properties. Resistor-type impedance elements may be implemented using any suitable material available in a given technology, such as for example, poly-silicon material, crystal-silicon material, metal material, carbon material, composite materials (e.g., silicon-chrome), et cetera. Resistor-type materials may be provided as thin and/or thick films, in bulk form, in uniform/non-uniform structures, et cetera. Capacitor-type impedance elements may likewise be implemented using any suitable materials, including common structures such as poly-insulator-poly (PIP) capacitors, poly-insulator-metal (PIM) capacitors, metal-insulator-metal (MIM and MOM) capacitors, et cetera. Capacitor insulator layers may be air, vacuum, or various high/low dielectric materials. Impedance elements may be isolated from other devices by isolators such as silicon oxide, printed-circuit board materials, air, vacuum, PN junctions, plastics, ceramics, et cetera.

Any known method to overcome or suppress imperfections of circuits (or sub-circuits, e.g. a reference voltage circuit) may be used in combination with the present disclosure. The disclosed arrangement may be incorporated as a subsystem in a larger ADC system (e.g., it may be combined with ADCs of any type, including pipeline ADCs, SAR ADCs, delta-sigma ADCs, etc.). The present disclosure may be implemented in electrical and/or electro-mechanical systems of a higher degree of functional complexity, such as industrial control systems, medical applications (e.g., x-ray and MRI machines), consumer applications (e.g., games and television), etc.

An ADC system according to the present disclosure may provide multiple channels to interface several distinct analog signals, e.g., via a multiplexing front-end circuit and/or an array of sample-and-hold circuits. An ADC is described herein as an example of a fully-differential circuit that may be configured to receive V(VP,VN) from an interface circuit according to the present disclosure.

An ADC circuit including an interface circuit implemented according to the present disclosure may be implemented on a single semiconductor substrate, or as multiple semiconductors in a package, or as several devices assembled on a printed circuit board (or otherwise).

Those skilled in the art will recognize that the present disclosure may be advantageous for interfacing a broad range of fully-differential circuits, including, for example, filters and sensors.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein.

What is claimed is:

1. An analog-to-digital converter (ADC) circuit including a fully-differential ADC and an interface circuit for driving the fully-differential ADC, the interface circuit being configured to receive a first input voltage and a second input voltage, and further configured to provide a first output voltage and a second output voltage, the interface circuit comprising:
   a first circuit configured to receive the first and second input voltages, and provide a voltage at an output of the first circuit; the first circuit is configured to decrease the voltage at the output of the first circuit in response to an increase in an average value of the first and second input voltages;
   a first network configured to receive the first input voltage and the voltage at the output of the first circuit, and further configured to provide the first output voltage; the first network being characterized by a first impedance ratio; and
   a second network configured to receive the second input voltage and the voltage at the output of the first circuit, and further configured to provide the second output voltage; the second network being characterized by a second impedance ratio substantially matched to the first impedance ratio.

2. A method of driving a fully-differential circuit using an interface circuit having a first circuit and first and second networks coupled to the first circuit, the method comprising the steps of:
   providing the first circuit with first and second input voltages,
   decreasing an output voltage of the first circuit in response to an increase in an average value of the first and second input voltages,
   supplying the first input voltage and the output voltage of the first circuit to the first network to produce a first output voltage for driving a first input of the fully-differential circuit, and supplying the second input voltage and the output voltage of the first circuit to the second network to produce a second output voltage for driving a second input of the fully-differential circuit,
wherein an impedance ratio of the first network is substantially matched to an impedance ratio of the second network.

3. An interface circuit for driving a fully-differential circuit, the interface circuit being configured to receive a first input voltage and a second input voltage, and further configured to provide a first output voltage and a second output voltage, the interface circuit comprising:
a regulator circuit configured to receive the first and second input voltages, and provide a regulator voltage at an output of the regulator circuit; the regulator circuit is configured to decrease the regulator voltage at the output of the regulator circuit in response to an increase in an average value of the first and second input voltages;
a first network configured to receive the first input voltage and the regulator voltage, and further configured to provide the first output voltage; the first network being characterized by a first impedance ratio; and
a second network configured to receive the second input voltage and the regulator voltage, and further configured to provide the second output voltage; the second network being characterized by a second impedance ratio substantially matched to the first impedance ratio.

4. The circuit of claim 3, wherein the first impedance ratio substantially is a ratio of impedance values of two resistors included in the first network.

5. The circuit of claim 4, wherein the second impedance ratio substantially is a ratio of impedance values of two resistors included in the second network.

6. The circuit of claim 3, wherein the first output voltage is substantially equal to a weighted average of the first input voltage and the regulator voltage.

7. The circuit of claim 3, wherein the first impedance ratio is substantially equal to one.

8. The circuit of claim 3, wherein the first and second networks are interchangeable.

9. The circuit of claim 3, wherein the first and second networks are incorporated within a differential network.

10. The circuit of claim 3, wherein the first network includes a first resistor having a first terminal coupled to a first input node supplied by the first input voltage and having a second terminal coupled to a first output node at which the first output voltage is provided.

11. The circuit of claim 10, wherein the first network further includes a second resistor having a first terminal coupled to the second terminal of the first resistor and a second terminal coupled to a node at which the regulator voltage is provided.

12. The circuit of claim 11, wherein the second network includes a third resistor having a first terminal coupled to a second input node supplied with the second input voltage and having a second terminal coupled to a second output node at which the second output voltage is provided.

13. The circuit of claim 12, wherein the second network includes a fourth resistor having a first terminal coupled to the second terminal of the third resistor and a second terminal coupled to the node at which the regulator voltage is provided.

14. The circuit of claim 13, wherein the first impedance ratio is a ratio of impedance values of the first and second resistors, and the second impedance ratio is a ratio of impedance values of the third and fourth resistors.

15. The circuit of claim 3, wherein the regulator circuit is distinct from the first and second networks.

16. The circuit of claim 3, wherein the regulator circuit includes first and second input nodes for receiving the first and second input voltages, and an output node at which the regulator voltage is provided; and the regulator circuit is coupled to the first and second networks only via the first and second input nodes and the output node.

17. The circuit of claim 3, wherein the regulator circuit comprises an operational amplifier and a third network characterized by a third impedance ratio which is substantially matched to the first and second impedance ratios.

18. The circuit of claim 17, wherein the third network is a substantially resistive network.

19. The circuit of claim 18, wherein the regulator circuit includes first and second input nodes for receiving the first and second input voltages, and an output node at which the regulator voltage is provided; and the third network includes first and second resistors coupled between the first and second input nodes, and a third resistor coupled between a node connecting the first and second resistors and the output node.

20. The circuit of claim 19, wherein the third resistor is coupled between an inverting input and an output of the operational amplifier.

21. The circuit of claim 20, wherein an impedance value of the first resistor is substantially equal to an impedance value of the second resistor, which is substantially equal to two times an effective impedance value of a parallel configuration representing the first and second resistors.

22. The circuit of claim 21, wherein the third impedance ratio is a ratio of the effective impedance value and an impedance value of the third resistor.

23. The circuit of claim 3, wherein the interface circuit is configured to drive a fully-differential analog-to-digital converter.

24. The circuit of claim 23, wherein the fully-differential analog-to-digital converter is implemented on a semiconductor substrate shared with at least a portion of the interface circuit.

25. The circuit of claim 23, wherein the interface circuit and the fully-differential analog-to-digital converter are arranged in a shared package.

26. The circuit of claim 3, wherein a difference between the first and second output voltages is substantially independent of an average value of the first and second input voltages.

27. The circuit of claim 3, wherein a difference between the first and second output voltages is substantially independent of the regulator voltage provided by the regulator circuit.

28. The circuit of claim 3, wherein the regulator circuit is configured to receive a control voltage, and the regulator voltage provided by the regulator circuit is substantially a linear combination of the first and second input voltages and the control voltage.

29. The circuit of claim 28, wherein an average value of the first and second output voltages is substantially equal to the control voltage.

30. The circuit of claim 3, wherein the regulator circuit comprises a switched capacitor.

31. The circuit of claim 3, wherein an input impedance of the interface circuit is substantially resistive.

* * * * *